(12) United States Patent
Wang et al.

(10) Patent No.: US 7,212,404 B2
(45) Date of Patent: May 1, 2007

(54) INTEGRATED HEAT SINK DEVICE

(75) Inventors: Frank Wang, Taipei (TW); Yi-Lun Cheng, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 247 days.

(21) Appl. No.: 11/108,688

(22) Filed: Apr. 19, 2005

(65) Prior Publication Data
US 2006/0232933 A1    Oct. 19, 2006

(51) Int. Cl.
*H05K 7/20*    (2006.01)
(52) U.S. Cl. ...................................... 361/697
(58) Field of Classification Search ................ 361/697, 361/699, 687, 689, 696; 174/15.1, 252
See application file for complete search history.

(56) References Cited

U.S. PATENT DOCUMENTS 6,359,780 B1 *   3/2002  McMahan et al. .......... 361/687
6,763,880 B1 *   7/2004  Shih ........................... 165/80.4
6,964,295 B1 *  11/2005  Yu et al. ................. 165/104.33
7,113,404 B2 *   9/2006  Naganawa et al. .......... 361/699

* cited by examiner

*Primary Examiner*—J. F. Duverne
(74) *Attorney, Agent, or Firm*—Reed Smith LLP; Stanley P. Fisher, Esq.; Juan Carlos A. Marquez, Esq.

(57) ABSTRACT

An integrated heat sink device, which is utilized to dissipate the heat generated by heat-generating elements with different angles of radiation surface (for instance, CPU and display chip are with radiation surfaces at 180° and 90°), is provided. The integrated heat sink device comprises a thermal module and a fan module; wherein the thermal module further comprises a first heat conduction module, a fin set, and a second heat conduction module; wherein the fan module, its vent connects with the fin set in an air-tight manner in order to form a heat-dissipating channel; and the first and second heat conduction modules are with different angles of heat connected surfaces so that the invention of the integrated heat sink device can dissipate the heat generated by heat-generating elements with different angles of radiation surface.

19 Claims, 6 Drawing Sheets

INTEGRATED HEAT SINK DEVICE

BACKGROUND OF THE INVENTION

1. Field of the Invention

This invention relates to a heat sink device. More particularity, the present invention relates to an integrated heat sink device, which is utilized to dissipate the heat generated from different angles of radiation surface of heat source components (i.e. Central Processing Unit (CPU) and display chip are with radiation surfaces at 180° and 90°).

2. Description of the Related Art

With information technology progress, computers are widely used. With the continuous upgrade in operation ability and speed of the CPU or the display chip of computer, results in a high temperature when high speed and large quantity operation in those electronic components. However, each electronic component has a temperature limit. The high temperature not only will reduce the working efficiency of the electronic component, but also may damage or even burnout the electronic component. Therefore, the heat-dissipating issue becomes one of important issue in the product design of a computer. In order to make the computer work at a normal temperature, a heat sink device has been a necessary component in a computer.

In an ordinary computer circuit arrangement, the CPU and the display chip are major operation units. As the high speed and large quantity operation in the CPUs or display chip of computer, result the high temperature occurred; those high temperature become an important topic need to be overcome in notebook computers. However, as the limitation space inside and small outside of a notebook computer, it is very important to well utilize the limitation space in designing the circuit and arranging the mechanism in the notebook computer.

Usually, the CPU, or display chip is arranged on the same print circuit board (PCB) in a conventional notebook computer. Therefore, the CPU or display chip is installed in the same plane, and the related heat sink devices are arranged in the same plane as well. Because of this, the design of related heat sink assembly will be designed on the same plane. Thus, when install all the circuits or apparatus at the same horizontal plane will have crowed space in a notebook computer while more space in vertical room is not be utilized.

As customers demand more and more on efficiency and for upgrading to the display card, hence, the design of display card is tend to be detachable which like a interface card of a table computer, not to fix to the mother board any more. To minimize the installed space of the detachable display card, the design of the detachable display card in insert way is different from the table computer which is horizontally inserted in a slot on the mother board, but the display card of a table computer is vertical inserted in a slot on the mother board. Therefore, how to dissipate the heats generated from different angles of radiation surface of heat sources become a new topic and need to be overcome. The integrated heat sink device is gathering above topics and further to improve in conventional heat sink device.

SUMMARY OF THE INVENTION

The object of this invention is to provide an integrated heat sink device, which is utilized to dissipate the heat generated from different angles of radiation surface of heat source components in an electronic device. When a new heat dissipating problem caused by installing an interface card attached with display chips to a mother board is occured, the problem will be overcome by using this integrated heat sink device. The integrated heat sink device comprises an integrated heat sink device and a fan module.

The integrated heat sink device comprises a first heat conduction module, a fin set, and a second heat conduction module. The first heat conduction module includes a first thermal pad and a first heat conduction member; the first heat conduction member is stripe, one end of the first heat conduction member connects with the first thermal pad. The fin set is connected with the other end of the first heat conduction member. The second heat conduction module includes a second thermal pad and a second heat conduction member; the second heat conduction member is also a stripe; one end of the member connects with the second thermal pad, and the other end connects with the fin set in a thermal conductive manner. The heat contact surfaces of the second thermal pad and the first thermal pad are formed in different angles. The fan module, in order to form an air channel, its air vent is air-tighted with the fin set.

The present invention of an integrated heat sink device is to save space and to efficiently dissipate the heat generated by different angle surfaces of heat source components. The integrated heat sink device has two thermal pads which separately thermal connect with different angle surfaces of display chip and CPU. Via the two heat conduction members, heat can be transferred from the thermal pads to the fin set to dissipate heat. The fan module can produce cooling wind, the heat will be exchanged with cooling wind in the fin set. And a fan module can expel the heat from the computer in order to achieve the cooling objective.

Thus, the implementation of this invention brings forth at least the following desirable results:

1. The integrated heat sink device can dissipate the heat generated by different angle surfaces of the heat source components.

2. The integrated heat sink device can dissipate the heat generated from the CPU and the display chip at the same time.

3. The integrated heat sink device can integrate the heat sink module of CPU and the heat sink module of display chip as a unit to lower down the cost of production and operation.

4. When a notebook computer uses this integrated heat sink device, it will be easy to upgrade the display card.

5. The integrated heat sink device with simple components and with 3-dimensional apparatus can save more space and make the notebook computer light and small.

BRIEF DESCRIPTION OF THE DRAWINGS

The invention will become more fully understood from the detailed description given below for illustration only, and thus are not limitative of the present invention, and wherein.

DETAILED DESCRIPTION OF THE INVENTION

Figure 1:
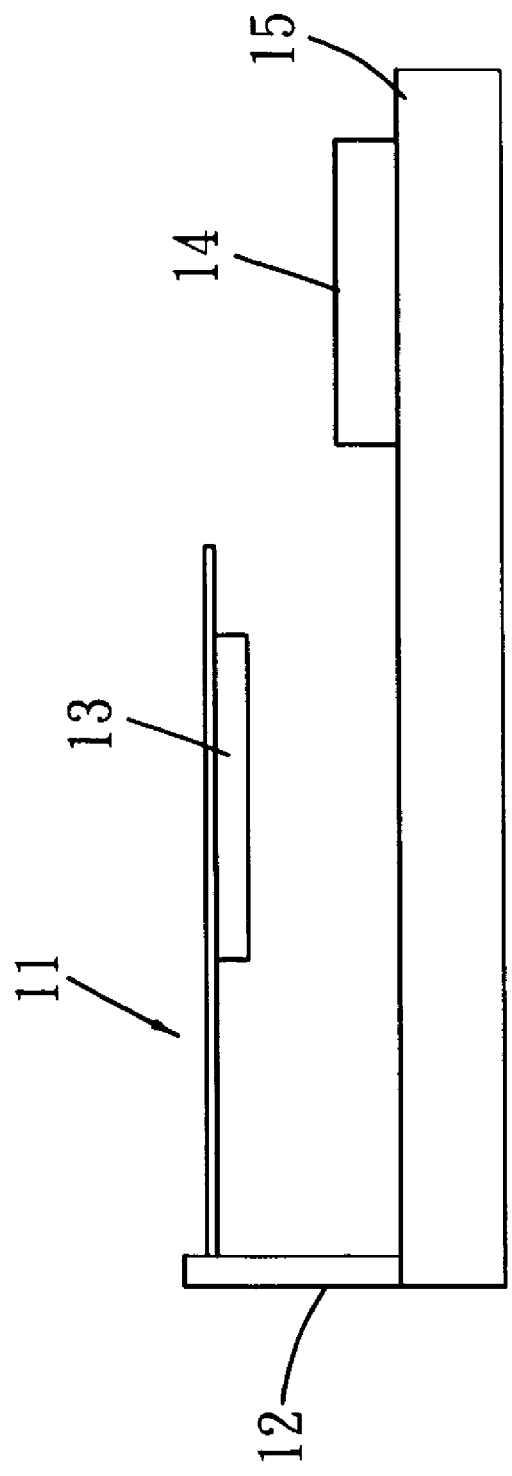
FIG. 1 is a sectional view of one embodiment of a display card in use.

FIG. 1 shows a section view of one embodiment of a display card in use. When a display card 11 is horizontally inserted in a slot element 12, a display chip 13 is located down below the printed circuit board (PCB) of the display card 11; the radiation surface of the display chip 13 is directed downward, and a CPU 14 is put on a mother board 15 in a conventional manner. Therefore, the radiation surfaces of the CPU 14 and the radiation surfaces of the display chip 13 are at different angles of plane, and the included an angle between the two surfaces is 180°.

Figure 2:
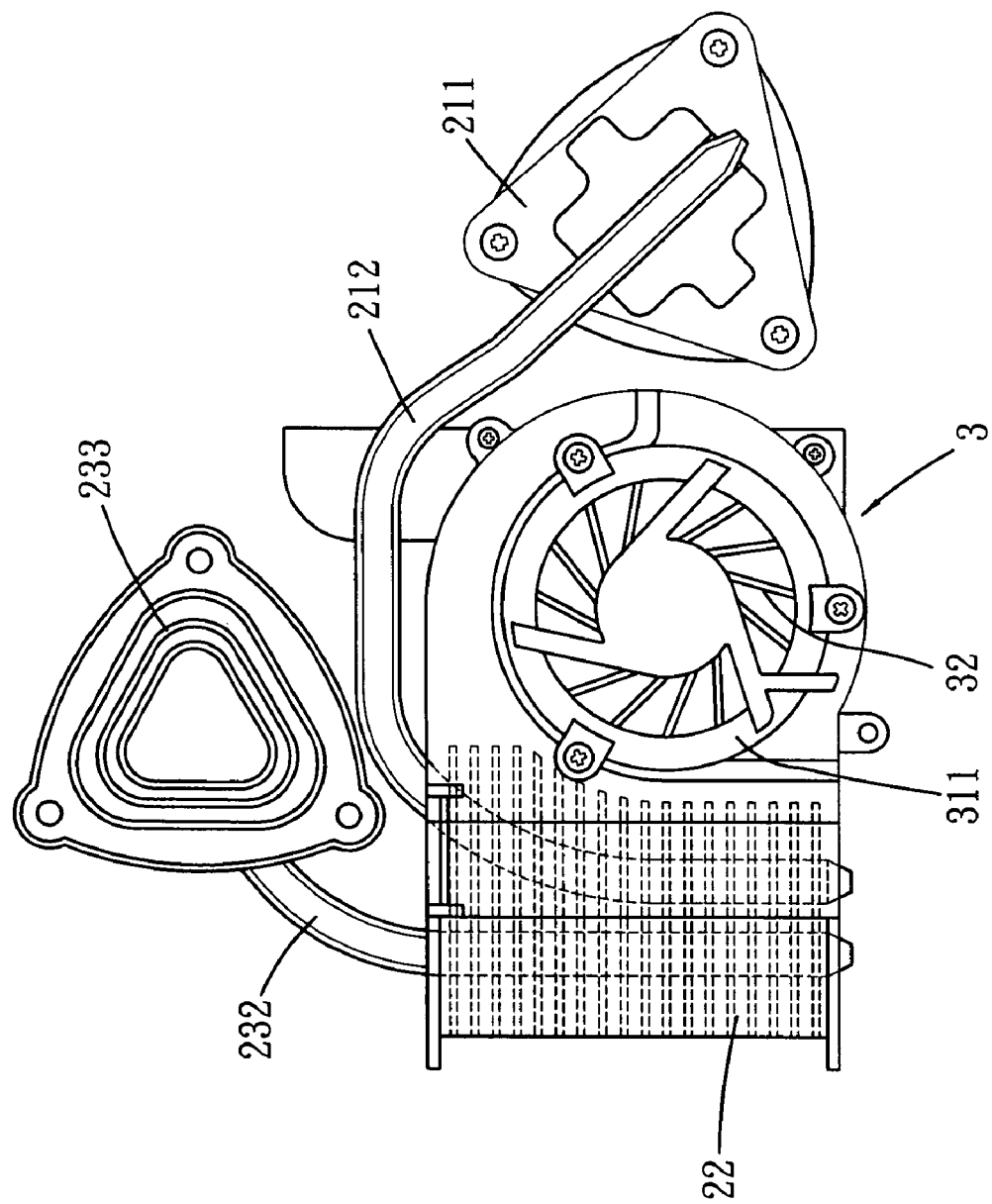
FIG. 2 is a top view of a heat sink device of one embodiment of the present invention.
Figure 3:
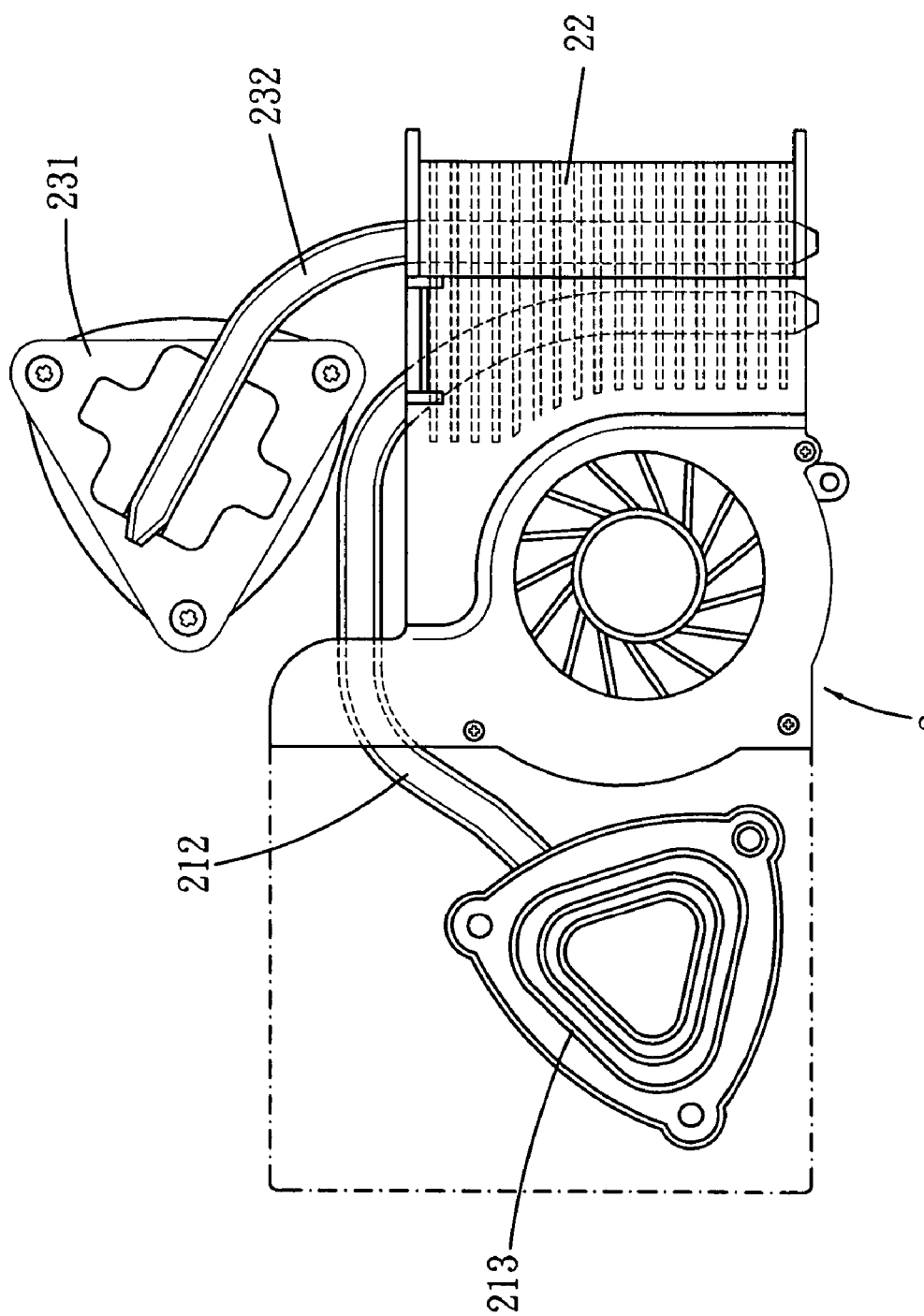
FIG. 3 is a bottom view of the heat sink device of one embodiment of the present invention.

FIGS. 2 and 3 show top and bottom perspective views of the integrated heat sink device. The present invention of integrated heat sink device is utilized in an electronic device to dissipate the heat generated by heat source components (CPU and display chip) with different angles of radiation surfaces, especially to utilize in electronic devices of the notebook computer. The device comprises a thermal module 2 and fan module 3.

Figure 4:
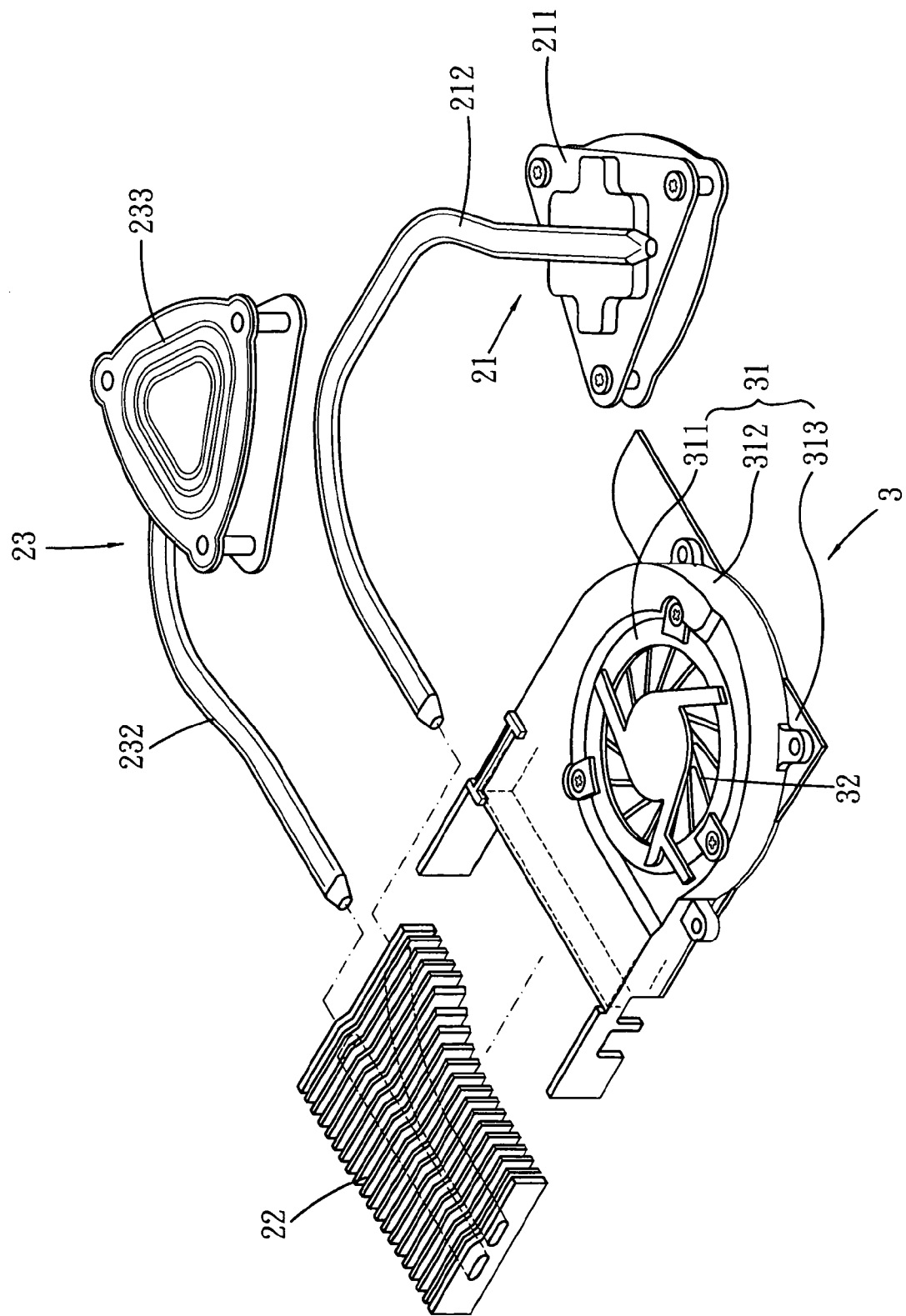
FIG. 4 is an exploded view of the heat sink device of one embodiment of the present invention.

FIG. 4 shows an exploded perspective view of the integrated heat sink device. The thermal module 2 further comprises a first heat conduction module 21, a fin set 22 and a second heat conduction module 23. The first heat conduction module 21 includes a first thermal pad 211 and a first heat conduction member 212. The first heat conduction member 212 is a long heat pipe. One end is connected with the first thermal pad 211 in a thermal conductive manner. The fin set 22 further comprises a plurality of parallel fins, and each fin is a stripe. The other end of the first heat conduction member 212 centrally penetrates the fin set in a thermal conductive manner. The second heat conduction module 23 comprises a second thermal pad 231 and a second heat conduction member 232. The second thermal contact surface 233 of the second thermal pad 231 and the first thermal contact surface 213 of the first thermal pad 211 are at a different angle. The second heat conduction member 232 is a long heat pipe, and one end is connected with the second thermal pad 231 and the other end centrally penetrates the fin set in a thermal conductive manner. The first heat conduction member 212 and the second heat conduction member 232 are in parallel to each other in the fin set 22. The thermal module 2 is utilized to conduct, transfer and dissipate heat; therefore, thermal module 2 is made of a material which can stand with a high temperature and can have well heat conduction. The thermal module 2 is made of copper or aluminum.

Figure 5:
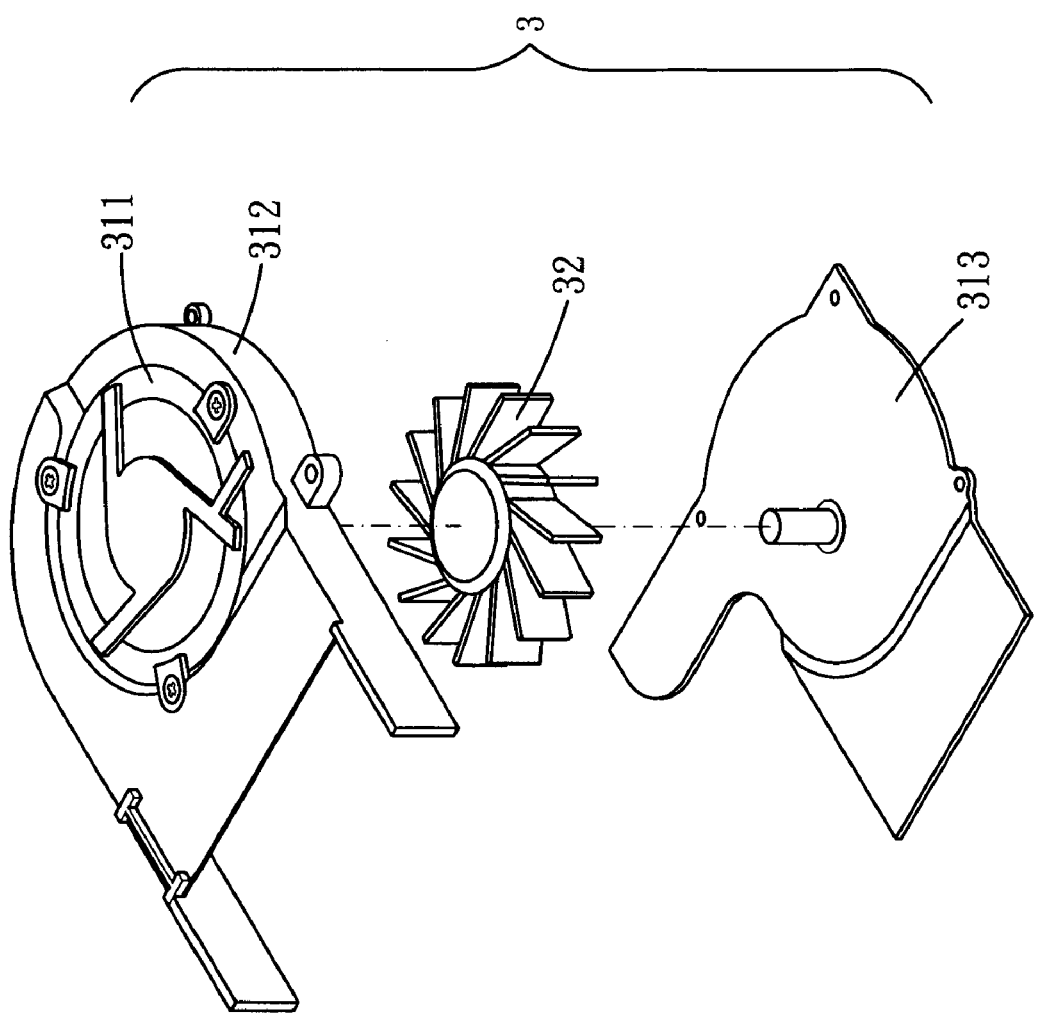
FIG. 5 is an exploded view of a fan module of one embodiment of present invention.

FIG. 5 shows an exploded perspective view of a fan module of one embodiment of present invention. The fan module 3 comprises a housing 31 and a fan 32; the housing 31 includes a cover 311, a shell 312 and a bottom plate 313. The cover 311 has an air inlet on an air entry of the fan 32 to provide air flow during the operation of the fan 32. The shell 312 includes a plate and a vertical wall which is extending from the edge of the plate. The shell 312 has an air inlet on air entry of the fan 32 and the vertical wall has a cutout nearby the fin set 22; and the bottom of the vertical wall is connected with a bottom plate 313 by means of screws. After combination of the shell 312 and the bottom plate 313, an air outlet is formed. The air outlet is connected with the fin set 22 in an airtight manner in order to form an air channel. The shell 312 is screwed to the cover 311, so the housing 31 becomes a chamber. The fan 32 is installed in the housing 31 for generating cooling wind.

Figure 6:
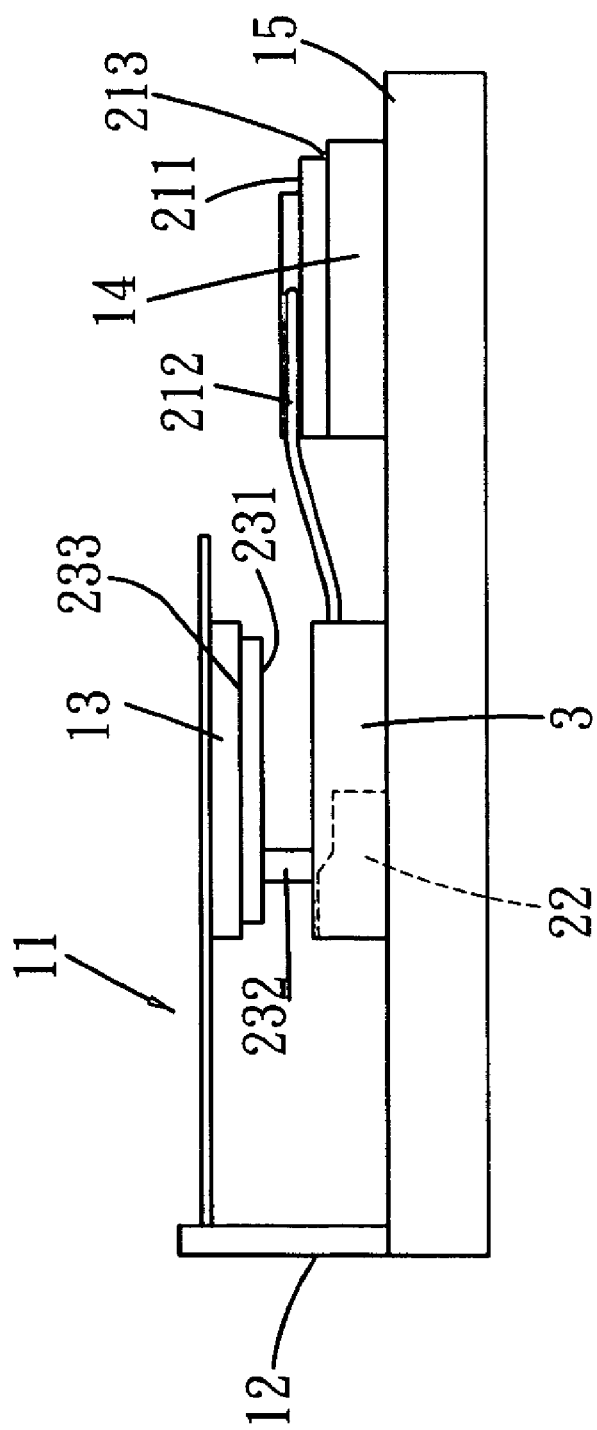
FIG. 6 is a sectional view of the heat sink device in use of one embodiment of the present invention.

FIG. 6 shows a sectional view of the heat sink device in use of one embodiment of the present invention. The first thermal pad 211 is connected with the radiation surface of the CPU 14 in a thermal conductive manner; the second thermal pad 231 is connected with the radiation surface of the display chip 13 in a thermal conductive manner. Via the first thermal pad 211 and the second thermal pad 231, heat can be transferred out from the CPU 14 and the display chip 13. Then via the first heat conduction member 212 and the second heat conduction member 232, the heat generated by the CPU 14 and the display chip 13 can be further transferred from those thermal pad 211, 231 to the fin set 22. Through the heatsink fin set 22, the heat transferred by means of the first thermal conductor 212 and the second thermal conductor 232 is efficiently spread. Exchange of heat occurs between the heatsink fin set 22 and the cooling wind generated by the fan module 3. The heat is later expelled from the electronic device. Thus, cooling of the electronic device is achieved.

The angles of the thermal contact surface 213 of the first thermal pad 211 and the thermal contact surface 233 of the second thermal pad 231 are determined according to the positions of the central processor 14 and the display chip 13. If the positions are as shown in FIG. 1, then the thermal contact surface 213 of the first thermal pad 211 is different from the thermal contact surface 233 of the second thermal pad 231 by an angle of 180°. If the display card 11 is vertically installed on the mother board 15 conventionally, then the thermal contact surface 213 of the first thermal pad 211 is different from the thermal contact surface 233 of the second thermal pad 231 by an angle of 90°.

Those described above are only the preferred embodiments of the present invention, and it is no intended to limit the scope of the present invention. And equivalent variation and modification according to the appended claims of the present invention would not depart from the spirit of the present invention and is to be included within the scope of the present invention.

What is claimed is:

1. An integrated heat sink device utilized in an electronic device to dissipate the heat generated by heat-generating elements with different angles of radiation surface comprising:

a thermal module, said first thermal module further comprising:
   a first heat conduction module having a first thermal pad and a first heat conduction member, said first heat conduction member one end connected with said first thermal pad in a thermal conductive manner;
   a fin set connected with the other end of said first heat conduction member in a thermal conductive manner; and
   a second heat conduction module having a second thermal pad and a second heat conduction member, said second heat conduction member one end connected with said second thermal pad in a thermal conductive manner; the other end of said second heat conduction member connected with said fin set in a thermal conductive manner; and a fan module, said fan module having an air outlet and said air outlet connected with said fin set in an airtight manner, wherein said first thermal pad and said second thermal pad connected with different angles of said radiation surfaces of said heat-generating elements, and said air outlet connected with said fin set in an airtight manner to form an air channel.

2. The integrated heat sink device as claimed in claim 1, wherein said heat-generating elements are CPU and display chip.

3. The integrated heat sink device as claimed in claim 1, wherein said first and second heat conduction members are a stripe of apparatus.

4. The integrated heat sink device as claimed in claim 1, wherein said fin set includes a plurality of parallel fins.

5. The integrated heat sink device as claimed in claim 4, wherein said fins are stripes.

6. The integrated heat sink device as claimed in claim 1, wherein said first and second heat conduction members penetrate said fin set in a thermal conductive manner.

7. The integrated heat sink device as claimed in claim 1, wherein said first thermal pad further comprising a first thermal contact surface and said second thermal pad further comprising a second thermal contact surface, and having an included angle between the surfaces.

8. The integrated heat sink device as claimed in claim 7, wherein said included angle is 180°.

9. The integrated heat sink device as claimed in claim 7, wherein said included angle is 90°.

10. The integrated heat sink device as claimed in claim 1, wherein said first and second heat conduction members are in parallel to each other in said fin set.

11. The integrated heat sink device as claimed in claim 1, wherein said fan module further comprises a housing and a fan.

12. The integrated heat sink device as claimed in claim 11, wherein said housing includes a cover and a shell.

13. The integrated heat sink device as claimed in claim 12, wherein said cover has an air inlet on air entry of said fan.

14. The integrated heat sink device as claimed in claim 12, wherein said shell includes a plate and a vertical wall which is extending from the edge of said plate; and said vertical wall having a cutout on air channel, and the bottom of said vertical wall connected with a bottom plate by means of screws.

15. The integrated heat sink device as claimed in claim 12, wherein said shell is connected with said cover and said bottom plate to form an air chamber and an air outlet.

16. The integrated heat sink device as claimed in claim 11, wherein said fan is installed in said housing.

17. The integrated heat sink device as claimed in claim 1, wherein said thermal module is made of a material which can stand with a high temperature and can have well heat conduction.

18. The integrated heat sink device as claimed in claim 1, wherein said thermal module is made of copper or aluminum.

19. The integrated heat sink device as claimed in claim 1, wherein said first and second heat conduction members are heat pipes.

* * * * *